(12) United States Patent
Yamamoto

(10) Patent No.: US 11,394,358 B2
(45) Date of Patent: Jul. 19, 2022

(54) FILTER CIRCUIT AND COMMUNICATION DEVICE

(71) Applicant: Murata Manufacturing Co., Ltd., Kyoto (JP)

(72) Inventor: Michiyo Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/031,337

(22) Filed: Sep. 24, 2020

(65) Prior Publication Data

US 2021/0006221 A1 Jan. 7, 2021

Related U.S. Application Data

(63) Continuation of application No. PCT/JP2019/003799, filed on Feb. 4, 2019.

(30) Foreign Application Priority Data

Apr. 4, 2018 (JP) .............................. JP2018-072378

(51) Int. Cl.
*H03H 7/01* (2006.01)
*H03F 3/19* (2006.01)
(Continued)

(52) U.S. Cl.
CPC .............. *H03H 7/0115* (2013.01); *H03F 3/19* (2013.01); *H04B 1/40* (2013.01);
(Continued)

(58) Field of Classification Search
CPC ... H03H 7/0115; H03F 3/19; H03F 2200/165; H03F 2200/451; H04B 1/40; H03K 5/00; H03K 2005/00013; H03K 2005/00286
See application file for complete search history.

(56) References Cited

U.S. PATENT DOCUMENTS 4,956,643 A * 9/1990 Hahn, III ............. H04B 7/2041
342/368
6,480,706 B1 * 11/2002 Mimura ................. H01Q 1/364
333/99 R
(Continued)

FOREIGN PATENT DOCUMENTS

JP S63191701 U 12/1988
JP 2008-148186 A 6/2008
(Continued)

OTHER PUBLICATIONS

International Search Report for International Application No. PCT/JP2019/003799 dated Apr. 23, 2019.
(Continued)

*Primary Examiner* — Dinh T Le
(74) *Attorney, Agent, or Firm* — Pearne & Gordon LLP

(57) ABSTRACT

A filter circuit includes a filter that is disposed on a path connecting a common terminal and an input output terminal and uses a first frequency band as a pass band, a filter that is disposed on a path connecting the common terminal and an input output terminal and uses a second frequency band different from the first frequency band as a pass band, and a phase adjustment circuit that has an input terminal connected to the path and an output terminal connected to the path, and adjusts a phase of a signal in the first frequency band input from the path and outputs a signal having a phase different from a phase of the signal in the first frequency band to the output terminal, wherein the path and the path are paths through which a received signal passes.

9 Claims, 7 Drawing Sheets

(51) Int. Cl.
*H04B 1/40* (2015.01)
*H03K 5/00* (2006.01)

(52) U.S. Cl.
CPC .. *H03F 2200/165* (2013.01); *H03F 2200/451* (2013.01); *H03K 5/00* (2013.01); *H03K 2005/00013* (2013.01); *H03K 2005/00286* (2013.01)

(56) References Cited

U.S. PATENT DOCUMENTS

| | | | | |
|---|---|---|---|---|
| 6,545,542 | B2* | 4/2003 | Matsuyoshi | H03F 1/3205 330/124 R |
| 9,172,422 | B2* | 10/2015 | Desclos | H04B 1/44 |
| 9,337,991 | B2* | 5/2016 | Ali-Ahmad | H04B 15/04 |
| 10,484,022 | B2* | 11/2019 | Nilsson | H04B 1/40 |
| 2008/0144485 | A1 | 6/2008 | Matsumoto | |
| 2010/0150075 | A1 | 6/2010 | Inoue et al. | |
| 2014/0125428 | A1 | 5/2014 | Iwaki | |
| 2014/0341090 | A1 | 11/2014 | Kawachi et al. | |
| 2017/0331456 | A1 | 11/2017 | Ono | |
| 2019/0140670 | A1 | 5/2019 | Hanaoka | |

FOREIGN PATENT DOCUMENTS

| | | |
|---|---|---|
| JP | 2013-048491 A | 3/2013 |
| JP | 2013-098785 A | 5/2013 |
| JP | 2014-096671 A | 5/2014 |
| JP | 2017-204743 A | 11/2017 |
| WO | 2013/118237 A1 | 8/2013 |
| WO | 2018/008274 A1 | 1/2018 |

OTHER PUBLICATIONS

Written Opinion for International Application No. PCT/JP2019/003799 dated Apr. 23, 2019.

* cited by examiner

FILTER CIRCUIT AND COMMUNICATION DEVICE

This is a continuation of International Application No. PCT/JP2019/003799 filed on Feb. 4, 2019 which claims priority from Japanese Patent Application No. 2018-072378 filed on Apr. 4, 2018. The contents of these applications are incorporated herein by reference in their entireties.

BACKGROUND

The present disclosure relates to a filter circuit and a communication device.

Recent communication devices, such as mobile phones are required to support multiple bands so that a single terminal transmits and receives high-frequency signals in a plurality of frequency bands. In view of this, a filter circuit in which input output terminals on one side of a plurality of filters having different pass bands, in other words, a plurality of paths are connected to a common point has been developed. Since input output terminals on one side of a plurality of paths are connected to a common point, a signal of one path leaks to another path. That is, an insertion loss on the one path increases. To suppress signal leakage between filters (between paths), impedance is adjusted by matching circuits connected in series with the respective filters so that passage of a signal in a pass band of a filter disposed on one path is allowed and passage of a signal in pass bands of the other filters is not allowed.

International Publication No. 13/118237 discloses a technique related to such a filter circuit.

BRIEF SUMMARY

However, in a case where a larger number of paths are connected to a common point to support a larger number of frequency bands, each matching circuit needs to perform the impedance adjustment across the plurality of frequency bands. This makes the impedance adjustment difficult. It is therefore sometimes impossible to suppress signal leakage sufficiently. As a result, an insertion loss in the filter circuit cannot be reduced sufficiently.

The present disclosure provides a filter circuit that can effectively reduce an insertion loss.

According to embodiments of the present disclosure, a filter circuit includes a first filter that is disposed on a first path connecting a common terminal and a first input output terminal and uses a first frequency band as a pass band, a second filter that is disposed on a second path connecting the common terminal and a second input output terminal and uses a second frequency band different from the first frequency band as a pass band, and a phase adjustment circuit that has an input terminal connected to the first path and an output terminal connected to the second path, and adjusts a phase of a signal in the first frequency band input from the first path and outputs a signal having a phase different from a phase of the signal in the first frequency band to the output terminal, wherein the first path and the second path are paths through which a received signal passes.

According to embodiments of the present disclosure, a communication device includes an RF signal processing circuit that processes a high-frequency signal transmitted or received by an antenna element, and the filter circuit that transfers the high-frequency signal between the antenna element and the RF signal processing circuit.

According to the filter circuit etc. of the present disclosure, an insertion loss can be effectively reduced.

Other features, elements, characteristics and advantages of the present disclosure will become more apparent from the following detailed description of embodiments of the present disclosure with reference to the attached drawings.

DETAILED DESCRIPTION

Figure 1:
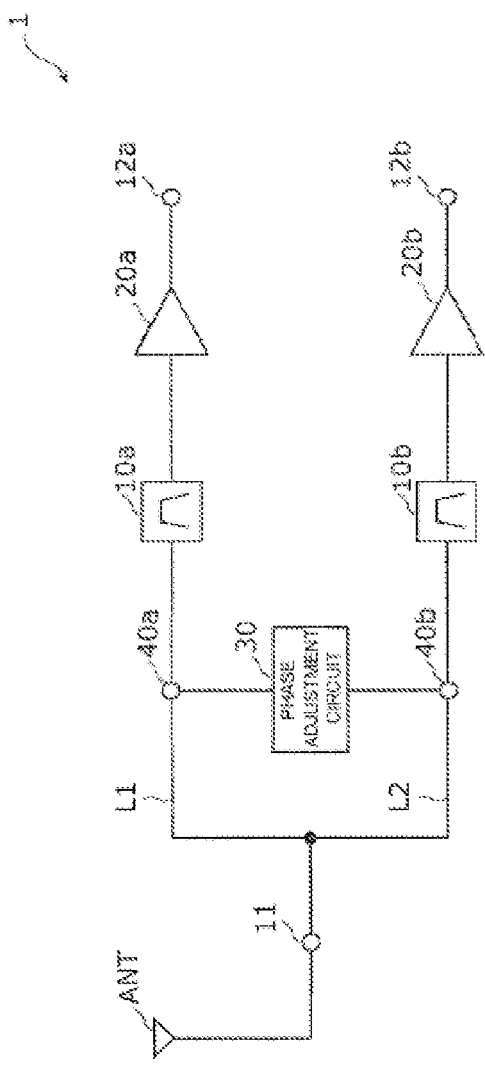
FIG. 1 is a configuration diagram illustrating a filter circuit according to Embodiment 1.

Embodiments of the present disclosure are described in detail below with reference to the drawings. The embodiments below illustrate general or specific examples. Numerical values, shapes, materials, constituent elements, and ways in which the constituent elements are disposed and connected in the embodiments below are examples and do not limit the present disclosure. Among the constituent elements in the embodiments below, constituent elements that are not recited in independent claims are described as optional constituent elements. In the drawings, substantially identical elements are given identical reference signs, and repeated description thereof is omitted or simplified. The expression "connected" in the embodiments below encompasses not only "directly connected", but also "electrically connected with another element or the like interposed therebetween".

Embodiment 1

1. Configuration of Filter Circuit

First, a configuration of a filter circuit according to Embodiment 1 is described below.

FIG. 1 is a configuration diagram illustrating a filter circuit 1 according to Embodiment 1. FIG. 1 illustrates an antenna element ANT in addition to the filter circuit 1. The filter circuit 1 includes filters 10a and 10b, amplifier circuits 20a and 20b, and a phase adjustment circuit 30.

The filter 10a is a first filter that is disposed on a path L1 (first path) that connects a common terminal 11 and an input output terminal 12a (first input output terminal) and uses a first frequency band as a pass band. The first frequency band is, for example, LTE (Long Term Evolution) Band 1 (2100 MHz to 2170 MHz). The filter 10b is a second filter that is disposed on a path L2 (second path) that connects the common terminal 11 and an input output terminal 12b (second input output terminal) and uses a second frequency band different from the first frequency band as a pass band. The second frequency band is, for example, LTE Band 3 (1805 MHz to 1880 MHz).

The filters 10a and 10b are, for example, band pass filters each constituted by an acoustic wave filter. The filters 10a and 10b are not limited to acoustic wave filters and may be constituted by a different filter (e.g., LC filter). Furthermore, the filters 10a and 10b are not limited to band pass filters and may be low pass filters, high pass filters, band elimination filters, or the like. The first frequency band is not limited to Band 1 and may be a different band, and the second frequency band is not limited to Band 3 and may be a different band.

The antenna element ANT is connected to the common terminal 11, for example, with a switching circuit (not illustrated) interposed therebetween. The antenna element ANT transmits or receives a high-frequency signal. The antenna element ANT is a multi-band antenna that is compliant with a communication standard, such as LTE. Furthermore, the input output terminals 12a and 12b are connected, for example, to an RF signal processing circuit (RFIC: Radio Frequency Integrated Circuit) (not illustrated). Which of the filters 10a and 10b is used for communication is controlled, for example, by the RFIC. For example, carrier aggregation (CA), which concurrently performs communication using the first frequency band and communication using the second frequency band, may be performed.

The amplifier circuit 20a is a first amplifier circuit disposed on the path L1 and amplifies a signal in the first frequency band. The amplifier circuit 20a is disposed, for example, between the filter 10a and the input output terminal 12a on the path L1. The amplifier circuit 20b is a second amplifier circuit disposed on the path L2 and amplifies a signal in the second frequency band. The filter circuit 1 is used for receiving a signal, and the path L1 and the path L2 are paths through which the received signal (e.g., a high-frequency received signal received by the antenna element ANT connected to the common terminal 11) passes. Accordingly, the amplifier circuits 20a and 20b are circuits each including a low noise amplifier (LNA). Note that the filter circuit 1 may be used for transmitting a signal. In this case, the path L1 and the path L2 are paths through which the transmitted signal passes, and the amplifier circuits 20a and 20b are circuits each including a power amplifier (PA).

The phase adjustment circuit 30 has an input terminal 40a that is connected to the path L1 and an output terminal 40b that is connected to the path L2, and adjusts a phase of a signal in the first frequency band (the pass band of the filter 10a) input from the path L1 and outputs a signal having a phase different from a phase of the input signal to the output terminal 40b. For example, the phase adjustment circuit 30 inverts the phase of the input signal by about 180 degrees and supplies the inverted signal to the path L2 to which the output terminal 40b is connected. With this configuration, when the signal in the first frequency band passing through the path L1 leaks to the path L2, the leaking signal in the first frequency band is reflected without necessarily being able to enter the path L2 since the signal having a phase inverted with respect to the leaking signal has been supplied to the path L2. This can prevent the signal in the first frequency band from leaking to the path L2. Specifically, since a signal having a phase inverted with respect to the signal in the first frequency band is supplied to the path L2, impedance in the first frequency band obtained when the path L2 is viewed from the common terminal 11 is brought into an open state. Note that an amount of adjustment of the phase of the signal input to the phase adjustment circuit 30 is not limited to about 180 degrees and can be determined as appropriate.

The phase adjustment circuit 30 may have an input terminal 40a that is connected to the path L2 and an output terminal 40b that is connected to the path L1, and adjust a phase of a signal in the second frequency band (the pass band of the filter 10b) input from the path L2 and output a signal having a phase different from a phase of the input signal to the output terminal 40b.

The phase adjustment circuit 30 does not have a function of adjusting an amplitude of an input signal. That is, the phase adjustment circuit 30 is not a cancelling circuit that cancels the signal in the first frequency band leaking to the path L2 by adjusting an amplitude and a phase of an input signal and supplying the adjusted signal to the path L2. This is because the phase adjustment circuit 30 does not have a function of adjusting an amplitude as described above although the cancelling circuit always has a function of adjusting an amplitude.

A specific example of a configuration of the phase adjustment circuit 30 is described below with reference to FIGS. 2 through 5.

2. Specific Example of Phase Adjustment Circuit

Figure 2:
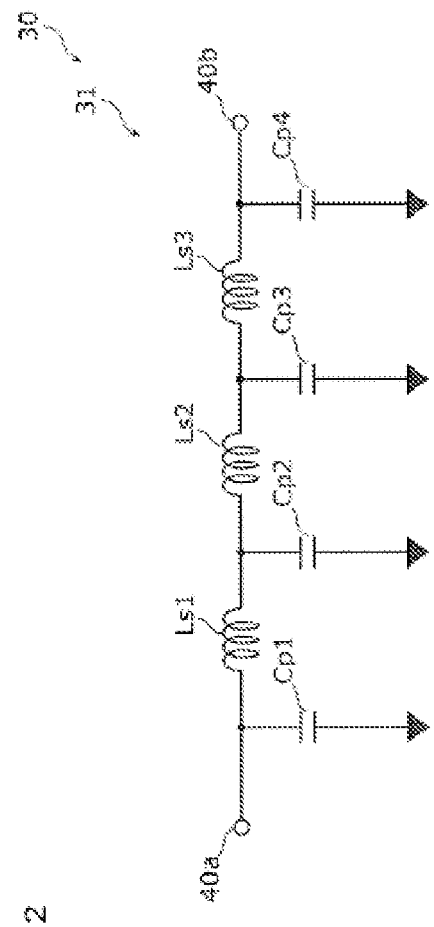
FIG. 2 is a configuration diagram illustrating a first example of a phase adjustment circuit according to Embodiment 1.

FIG. 2 is a configuration diagram illustrating a first example of the phase adjustment circuit 30 according to Embodiment 1.

As illustrated in FIG. 2, the phase adjustment circuit 30 includes, for example, a phase shifter 31. The phase shifter 31 includes at least one inductor disposed on a path connecting the input terminal 40a and the output terminal 40b and at least one capacitor disposed between the ground and a connection node provided on the path.

Note that the connection node is a connection point between elements or between an element and a terminal. As illustrated in FIG. 2, in a case where a plurality of capacitors are disposed, these capacitors are disposed between the ground and respective different connection nodes provided on the path.

In this example, the phase shifter 31 has, as the at least one inductor, inductors Ls1 to Ls3 that are connected in series with one another. Furthermore, the phase shifter 31 has, as the at least one capacitor, a capacitor Cp1 connected between the ground and a connection node between the input terminal 40a and the inductor Ls1, a capacitor Cp2 connected between the ground and a connection node between the inductors Ls1 and Ls2, a capacitor Cp3 connected between the ground and a connection node between the inductors Ls2 and Ls3, and a capacitor Cp4 connected between the ground and a connection node between the inductor Ls3 and the output terminal 40b. Note that the number of inductors and the number of capacitors are not limited to those described above and are determined as appropriate, for example, in accordance with a target amount of adjustment of a phase. Furthermore, an inductance value of the at least one inductor and a capacitance value of the at least one capacitor are also determined as appropriate, for example, in accordance with a target amount of adjustment of a phase.

Figure 3A:
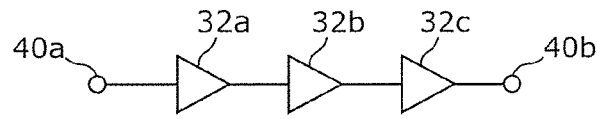
FIG. 3A is a configuration diagram illustrating a second example of a phase adjustment circuit according to Embodiment 1.

FIG. 3A is a configuration diagram illustrating a second example of the phase adjustment circuit 30 according to Embodiment 1.

The phase adjustment circuit 30 includes, for example, a delay element. As illustrated in FIG. 3A, the phase adjustment circuit 30 includes, as the delay element, at least one buffer disposed on a path connecting the input terminal 40a and the output terminal 40b. In this example, the phase adjustment circuit 30 has, as the at least one buffer, buffers 32a to 32c that are connected in series with one another. The number of buffers is not limited to that described above and is determined as appropriate, for example, in accordance with a target amount of delay (i.e., an amount of adjustment of a phase).

Figure 3B:
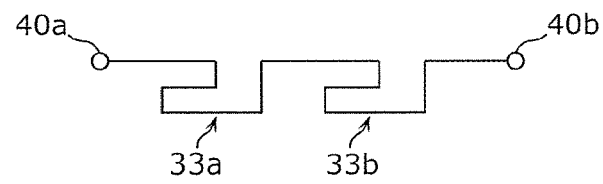
FIG. 3B is a configuration diagram illustrating another form of the second example of the phase adjustment circuit according to Embodiment 1.

FIG. 3B is a configuration diagram illustrating another form of the second example of the phase adjustment circuit 30 according to Embodiment 1.

As illustrated in FIG. 3B, the phase adjustment circuit 30 may include, as the delay element, a wire whose wire length has been adjusted. For example, in this example, the wire has an L shape and is therefore longer than a linear wire. That is, the phase adjustment circuit 30 is a wire that has portions 33a and 33b having adjusted wire lengths on a path (wire) connecting the input terminal 40a and the output terminal 40b and thus functions as a delay element. An amount of adjustment of the wire length is determined as appropriate, for example, in accordance with a target amount of delay (i.e., an amount of adjustment of a phase).

Figure 4:
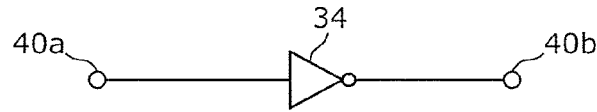
FIG. 4 is a configuration diagram illustrating a third example of a phase adjustment circuit according to Embodiment 1.

FIG. 4 is a configuration diagram illustrating a third example of the phase adjustment circuit 30 according to Embodiment 1.

As illustrated in FIG. 4, the phase adjustment circuit 30 includes, for example, an inverting circuit 34 disposed on a path connecting the input terminal 40a and the output terminal 40b. The inverting circuit 34 includes, for example, a transistor. The transistor may be a metal oxide semiconductor field effect transistor (MOSFET) or may be a bipolar transistor. The inverting circuit 34 may include, for example, a combination of a transistor and a passive element, such as a resistor or a capacitor. The phase adjustment circuit 30 can invert a phase by about 180 degrees due to the inverting circuit 34.

Figure 5:
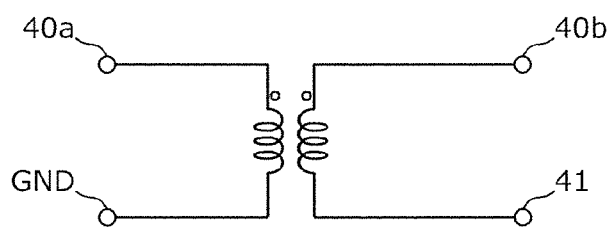
FIG. 5 is a configuration diagram illustrating a fourth example of the phase adjustment circuit according to Embodiment 1.

FIG. 5 is a configuration diagram illustrating a fourth example of the phase adjustment circuit 30 according to Embodiment 1.

As illustrated in FIG. 5, the phase adjustment circuit 30 includes, for example, a balun 35 (balance-unbalance converter). The balun 35 includes, for example, an inductor disposed on a path connecting the input terminal 40a and a ground terminal GND and an inductor disposed on a path connecting the output terminal 40b and an output terminal 41, and these inductors are electrically coupled to each other. With this configuration, a signal whose phase has been inverted can be extracted from the output terminal 40b. On each path (e.g., the path L1, L2), a matching circuit for elements (e.g., a filter, an amplifier circuit, a switch) disposed on the path is generally provided, and the matching circuit often includes an inductor. Accordingly, the inductor included in the matching circuit can be used as a part of the balun 35, and as a result, the filter circuit 1 including the phase adjustment circuit 30 can be reduced in size.

3. Specific Example of Phase Adjustment Circuit Having Function of Making Amount of Adjustment of Phase Variable The phase adjustment circuit 30 may have a function of making an amount of adjustment of a phase of a signal in the first frequency band input from the path L1 variable. A specific example of a configuration of the phase adjustment circuit 30 having a function of making an amount of adjustment of a phase variable is described below with reference to FIGS. 6 to 8.

Figure 6:
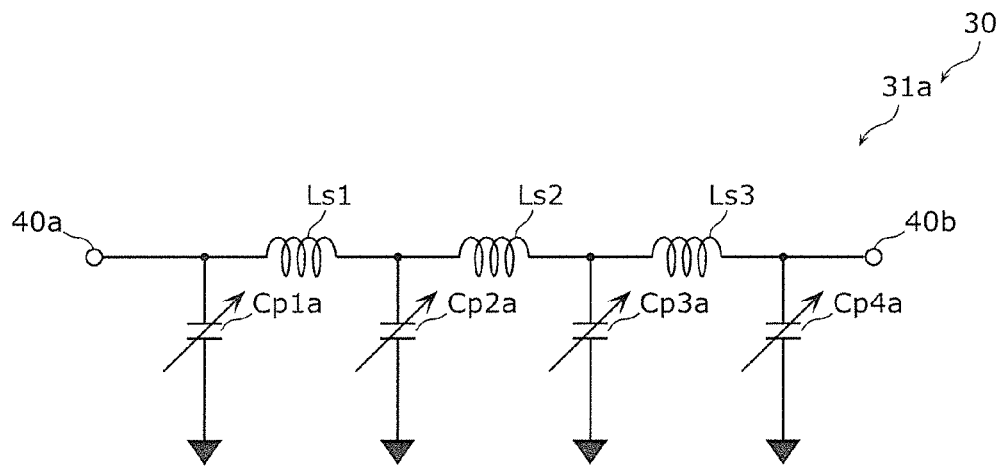
FIG. 6 is a configuration diagram illustrating a fifth example of the phase adjustment circuit according to Embodiment 1.

FIG. 6 is a configuration diagram illustrating a fifth example of the phase adjustment circuit 30 according to Embodiment 1.

As illustrated in FIG. 6, the phase adjustment circuit 30 includes, for example, a phase shifter 31a that has a function of making an amount of adjustment of a phase variable. The phase shifter 31a in this example is different from the phase shifter 31 in the first example in that variable capacitance diodes Cp1a to Cp4a whose capacitance values are variable are provided instead of the capacitors Cp1 to Cp4. Since the capacitance values of the variable capacitance diodes Cp1a to Cp4a are adjustable, an amount of adjustment of a phase can be made variable.

Figure 7:
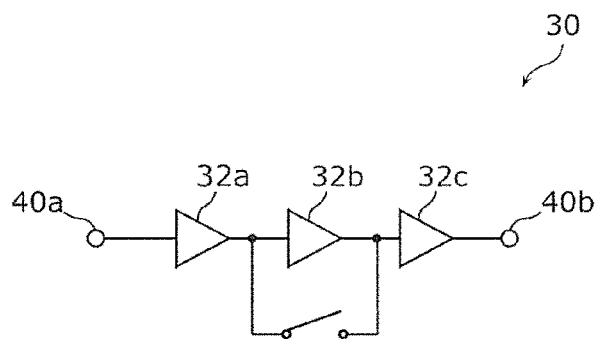
FIG. 7 is a configuration diagram illustrating a sixth example of the phase adjustment circuit according to Embodiment 1.

FIG. 7 is a configuration diagram illustrating a sixth example of the phase adjustment circuit 30 according to Embodiment 1.

As illustrated in FIG. 7, the phase adjustment circuit 30 includes, for example, a delay element having a function of making an amount of adjustment of a phase variable. Specifically, the delay element in this example is different from the delay element in the second example in that the delay element in this example includes a switch SW in addition to the buffers 32a to 32c illustrated in FIG. 3A. For example, one end of the switch SW is connected to one end of the buffer 32b, and the other end of the switch SW is connected to the other end of the buffer 32b. A place where the switch SW is connected and the number of switches SW are not limited to those described above. By turning the switch SW on or off, the number of effective buffers among the buffers 32a to 32c is changed. This can make an amount of delay (i.e., an amount of adjustment of a phase) variable. Specifically, in a case where the switch SW is turned on, a bypass path that bypasses the buffer 32b is formed. Accordingly, the number of buffers which a signal input from the input terminal 40a passes before being output from the output terminal 40b becomes smaller than that in a case where the switch SW is turned off. By thus adjusting the number of buffers which a signal passes in the phase adjustment circuit 30, an amount of adjustment of a phase can be made variable.

Figure 8:
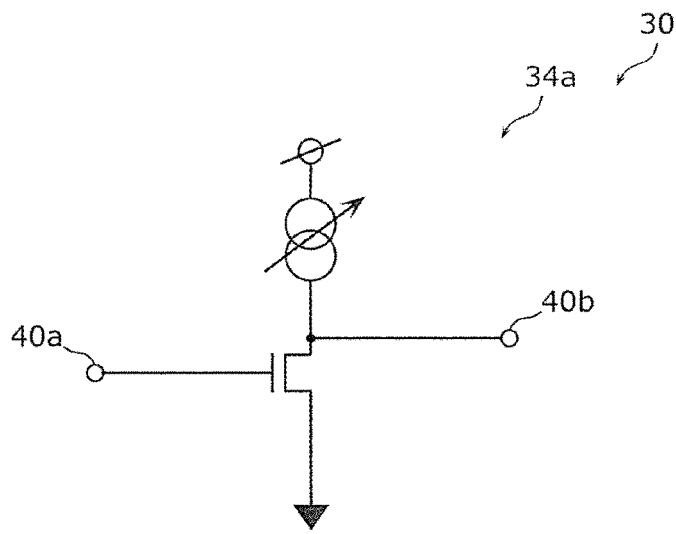
FIG. 8 is a configuration diagram illustrating a seventh example of the phase adjustment circuit according to Embodiment 1.

FIG. 8 is a configuration diagram illustrating a seventh example of the phase adjustment circuit 30 according to Embodiment 1.

FIG. 8 illustrates an inverting circuit 34a that has a function of making an amount of adjustment of a phase variable in the phase adjustment circuit 30. The inverting circuit 34a has, for example, an N-channel MOSFET and a current source. By changing a current amount of the current source in the inverting circuit 34a, a time in which output of the N-channel MOSFET falls or rises upon input of an ON signal or an OFF signal to the N-channel MOSFET can be changed. That is, by making the current amount of the current source variable, a period from input of a signal in the first frequency band to the N-channel MOSFET to output of the signal in the first frequency band from the N-channel MOSFET can be made variable. As a result, an amount of adjustment of a phase can be made variable.

4. Effects Etc.

As described above, the filter circuit 1 includes the filter 10a that is disposed on the path L1 connecting the common terminal 11 and the input output terminal 12a and uses the first frequency band as a pass band, the filter 10b that is disposed on the path L2 connecting the common terminal 11 and the input output terminal 12b and uses the second frequency band different from the first frequency band as a pass band, and the phase adjustment circuit 30 that has the input terminal 40a connected to the path L1 and the output terminal 40b connected to the path L2, and adjusts a phase of a signal in the first frequency band input from the path L1 and outputs a signal having a phase different from a phase of the signal in the first frequency band to the output terminal 40b, wherein the path L1 and the path L2 are paths through which a received signal passes.

According to this configuration, for example, by transmitting a signal whose phase has been adjusted (e.g., inverted) with respect to the signal in the first frequency band to the path L2, it becomes harder for the signal in the first frequency band to enter the path L2. In other words, impedance in the first frequency band obtained when the path L2 is viewed from the common terminal 11 becomes close to an open state. This is described below with reference to FIGS. 9A and 9B.

Figure 9A:
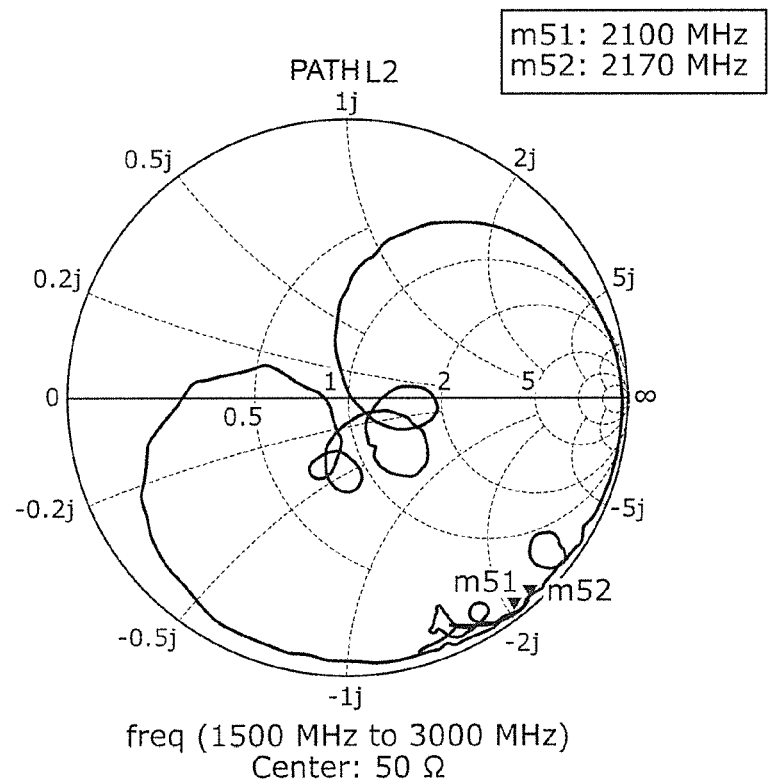
FIG. 9A is a smith chart illustrating impedance characteristics obtained when a second path is viewed from a common terminal side in a case where the phase adjustment circuit is not provided.
Figure 9B:
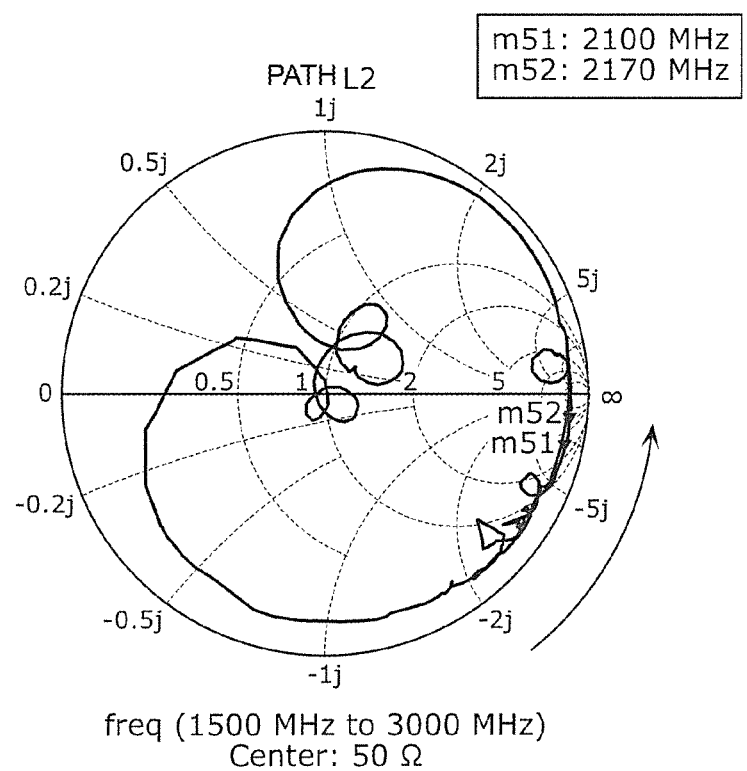
FIG. 9B is a smith chart illustrating impedance characteristics obtained when the second path is viewed from the common terminal side in a case where the phase adjustment circuit is provided.

FIG. 9A is a Smith chart illustrating impedance characteristics obtained when the second path (path L2) is viewed from the common terminal 11 side in a case where the phase adjustment circuit 30 is not provided. FIG. 9B is a Smith chart illustrating impedance characteristics obtained when the second path (path L2) is viewed from the common terminal 11 side in a case where the phase adjustment circuit 30 is provided. These smith charts are normalized, for example, by 50Ω. FIGS. 9A and 9B illustrate impedance characteristics in a range from 1500 MHz to 3000 MHz. As described above, the first frequency band is LTE Band 1 (2100 MHz to 2170 MHz), and a marker m51 indicates 2100 MHz, and a marker m52 indicates 2170 MHz. That is, the impedance characteristics in a frequency band between the marker m51 and the marker m52 in the range from 1500 MHz to 3000 MHz are impedance characteristics in the first frequency band obtained when the path L2 is viewed from the common terminal 11 side. Measurement (simulation) of impedance characteristics is conducted assuming that the path L2 is cut away from a portion of the path L1 that follows the input terminal 40a (a portion on the input output terminal 12a side relative to the input terminal 40a) to ignore influence from the path L1.

As illustrated in FIG. 9A, in a case where the phase adjustment circuit 30 is not provided, impedance in the first frequency band obtained when the path L2 is viewed from the common terminal 11 side is rotated in a clockwise direction from an open state and is located away from the open state on the Smith chart. Accordingly, a signal in the first frequency band is not sufficiently reflected on the path L2 and leaks to the path L2. Meanwhile, as illustrated in FIG. 9B, in a case where the phase adjustment circuit 30 is provided, impedance in the first frequency band obtained when the path L2 is viewed from the common terminal 11 side is rotated in a counterclockwise direction on the smith chart to be closer to the open state than the case where the phase adjustment circuit 30 is not provided. The second frequency band is LTE Band 3 (1805 MHz to 1880 MHz) as described above, and impedance characteristics in the second frequency band obtained when the path L2 is viewed from the common terminal 11 side are close to a center (e.g., 50Ω) both in the case where the phase adjustment circuit 30 is not provided and the case where the phase adjustment circuit 30 is provided (not indicated by a marker in FIGS. 9A and 9B). That is, matching has been achieved.

Although such impedance adjustment can be realized, for example, by providing a matching circuit, the matching circuit needs to perform the impedance adjustment across a plurality of frequency bands (LTE Band 1 and Band 3 in the above description). Accordingly, the impedance adjustment is difficult. In some cases, therefore, signal leakage cannot be sufficiently suppressed, and as a result, an insertion loss in the filter circuit cannot be sufficiently reduced. Meanwhile, in a case where the phase adjustment circuit 30 is provided, it is optional to perform impedance adjustment across a plurality of frequency bands. It is only necessary to bring impedance in one frequency band (LTE Band 1 in the above description) to an open state on the path L2. It is therefore easier for a signal in the first frequency band to be reflected totally on the path L2 than in a case where a matching circuit is used. This can suppress leakage of the signal in the first frequency band to the path L2, thereby effectively reducing an insertion loss on the path L1. Furthermore, since the signal in the first frequency band optional for the path L2 (for the signal of the second frequency band) is harder to enter the path L2, noise caused by the signal in the first frequency band can be reduced on the path L2.

Since an insertion loss can be effectively reduced in the filter circuit 1, SN characteristics can be kept good, and signal demodulation can be easily performed, for example, by the RFIC provided in a stage succeeding the filter circuit 1.

Another option for suppressing signal leakage to the path L2 is a method of separately providing a filter for blocking a signal in the first frequency band on the path L2. However, in this case, a signal in the second frequency band may also undesirably attenuate due to the filter depending on attenuation characteristics of the filter and a position of the second frequency band. Meanwhile, according to the present disclosure, when the signal in the first frequency band is totally reflected on the path L2, other frequency bands are not affected. It is therefore possible to effectively reduce an insertion loss on the path L1 without necessarily attenuating the signal of the second frequency band on the path L2. In particular, it is possible to effectively reduce an insertion loss in a filter circuit that handles a received signal.

Furthermore, according to the present disclosure, amplitude adjustment is optional in the phase adjustment circuit 30. It is therefore possible to effectively reduce an insertion loss on the path L1 without necessarily attenuating the signal in the second frequency band on the path L2 with a simple circuit configuration.

Furthermore, for example, the input terminal 40a may be connected between the common terminal 11 and the filter 10a, and the output terminal 40b may be connected between the common terminal 11 and the filter 10b.

Since the input terminal 40a of the phase adjustment circuit 30 is connected on the common terminal 11 side relative to the filter 10a (in a stage followed by the filter 10a), that is, close to the common terminal 11, the phase adjustment circuit 30 adjusts a phase of a signal of a higher signal intensity that has not passed a filter and the like. This makes the phase adjustment easier. Furthermore, since the output terminal 40b of the phase adjustment circuit 30 is connected close to the common terminal 11, a signal in the first frequency band is reflected on a side close to the common terminal 11. In this case, the signal in the first frequency band is reflected before the filter 10b (an element adjusted to reflect the signal in the first frequency band), impedance in the first frequency band can be made closer to the open state. It is therefore easier for the signal in the first frequency band to be totally reflected on the path L2. This can suppress signal leakage to the path L2, thereby more effectively reducing an insertion loss on the path L1.

Furthermore, for example, the phase adjustment circuit 30 may include the phase shifter 31. Furthermore, for example, the phase adjustment circuit 30 may include a delay element. Furthermore, for example, the phase adjustment circuit 30 may include the inverting circuit 34. Furthermore, for example, the phase adjustment circuit 30 may include the balun 35.

The phase adjustment circuit 30 can be thus constituted by the phase shifter 31, the delay element, the inverting circuit 34, or the balun 35. For example, in a case where the phase adjustment circuit 30 is constituted by the inverting circuit 34, an active element is used as the inverting element 34, and therefore an integrated circuit can be employed. For example, in a case where the phase adjustment circuit 30 is constituted by the balun 35, the balun 35 is constituted by an inductor only, an inductor included in a matching circuit on a path can be used as a part of the balun 35. This can achieve a reduction in size of the whole filter circuit 1.

Furthermore, for example, the phase adjustment circuit 30 may have a function of making an amount of adjustment of a phase of the signal in the first frequency band input from the path L1 variable.

With this configuration, an amount of adjustment of the phase can be freely changed in accordance with usage or the like. Furthermore, even in a case where variations occur in an amount of adjustment of the phase, for example, due to an environment, such as a temperature or manufacturing variations, the amount of adjustment of the phase can be freely changed to a desired amount. Furthermore, a reduction in insertion loss can be achieved even in a case where the input terminal 40a and the output terminal 40b are reversed (even in a case where the input terminal 40a is connected to the path L2 and the output terminal 40b is connected to the path L1 without necessarily changing a circuit configuration of the phase adjustment circuit 30). That is, a reduction in insertion loss can be achieved bidirectionally both on the path L1 and path L2 connected to the phase adjustment circuit 30 by using the single phase adjustment circuit 30.

Furthermore, for example, the filter circuit 1 may further include the amplifier circuit 20a disposed on the path L1 and the amplifier circuit 20b disposed on the path L2. The input terminal 40a may be connected between the common terminal 11 and the amplifier circuit 20a, and the output terminal 40b may be connected between the common terminal 11 and the amplifier circuit 20b.

In a case where the phase adjustment circuit 30 is connected on the input output terminal side (in a succeeding state) relative to each amplifier circuit, the amplifier circuit is sandwiched between the common terminal 11 and the phase adjustment circuit 30. This makes it difficult to bring impedance in the first frequency band obtained when the path L2 is viewed from the common terminal 11 into an open state, thereby making it difficult to totally reflect the signal in the first frequency band on the path L2. Meanwhile, in a case where the phase adjustment circuit 30 is connected on the common terminal 11 side relative to each amplifier circuit (in a stage followed by each amplifier circuit), the signal in the first frequency band is easily totally reflected on the path L2.

Embodiment 2

Next, a filter circuit according to Embodiment 2 is described with reference to FIG. 10.

Figure 10:
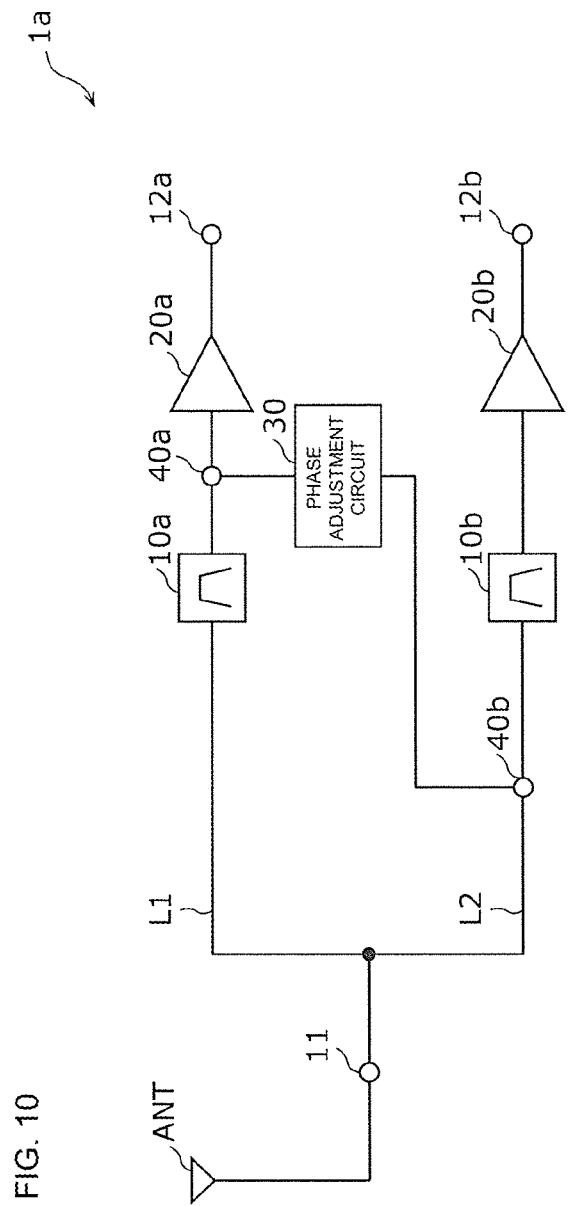
FIG. 10 is a configuration diagram illustrating a filter circuit according to Embodiment 2.

FIG. 10 is a configuration diagram illustrating a filter circuit 1a according to Embodiment 2.

FIG. 10 illustrates an antenna element ANT in addition to the filter circuit 1a.

The filter circuit 1a according to Embodiment 2 is different from the filter circuit 1 according to Embodiment 1 in that an input terminal 40a of a phase adjustment circuit 30 is connected between a filter 10a and an input output terminal 12a and an output terminal 40b is connected between a common terminal 11 and a filter 10b. The filter circuit 1a according to Embodiment 2 is identical to the filter circuit 1 according to Embodiment 1 except for this, and repeated description of identical parts is omitted. Specifically, the input terminal 40a is connected between the filter 10a and an amplifier circuit 20a.

The input terminal 40a of the phase adjustment circuit 30 is connected on an input output terminal 12a side relative to the filter 10a (in a stage following the filter 10a), and therefore the phase adjustment circuit 30 adjusts a phase of a signal whose noise has been reduced by passing the filter 10a. By transmitting, to a path L2, a signal whose phase has been adjusted with respect to a signal in the first frequency band whose noise has been reduced, accuracy of adjustment of impedance can be improved. This makes it harder for the signal in the first frequency band to enter the path L2. Furthermore, since the output terminal 40b of the phase adjustment circuit 30 is connected on the common terminal 11 side, impedance in the first frequency band can be made close to an open state at a position on the path L2 closer to the common terminal 11. This makes it easier for the signal in the first frequency band to be totally reflected on the path L2. It is therefore possible to suppress signal leakage to the path L2. As a result, it is possible to more effectively reduce an insertion loss on the path L1.

Embodiment 3

Next, a filter circuit according to Embodiment 3 is described with reference to FIG. 11.

Figure 11:
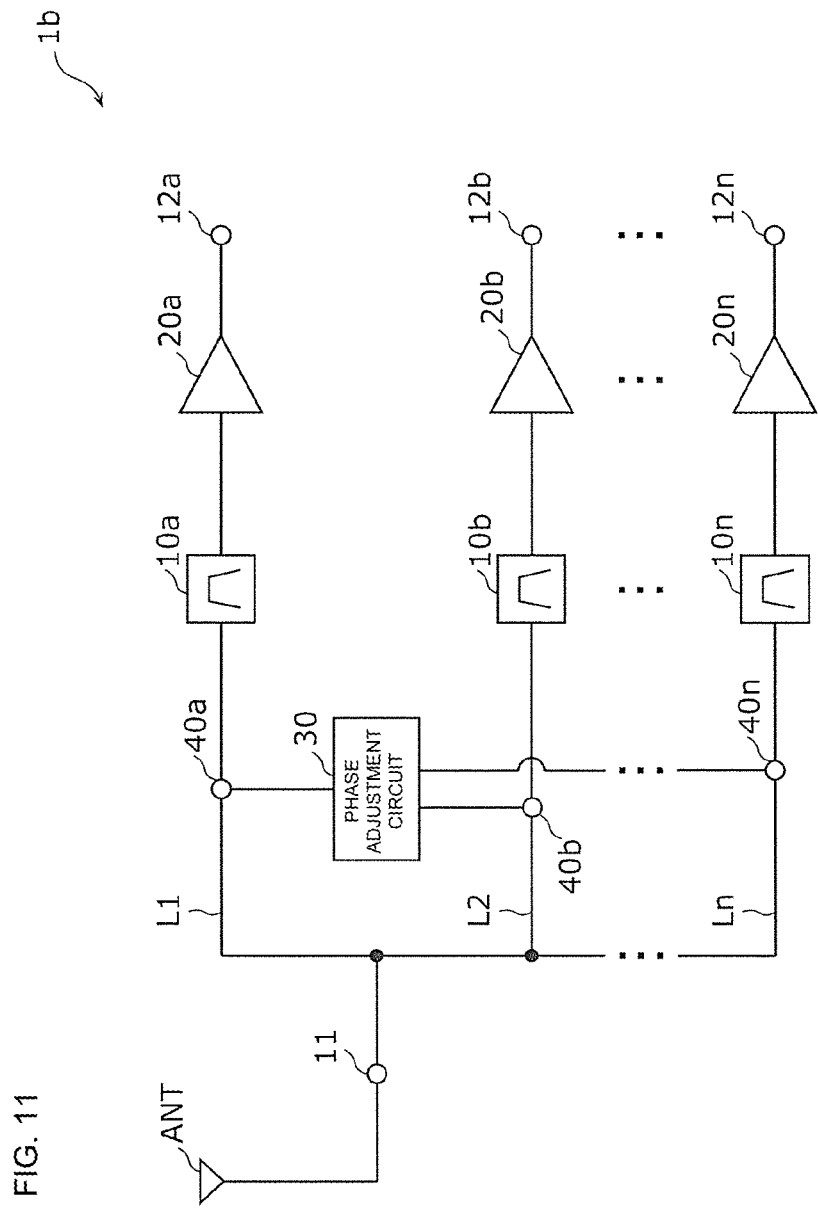
FIG. 11 is a configuration diagram illustrating a filter circuit according to Embodiment 3.

FIG. 11 is a configuration diagram illustrating a filter circuit 1b according to Embodiment 3. FIG. 11 illustrates an antenna element ANT in addition to the filter circuit 1b.

In Embodiment 3, filters 10a to 10n are disposed on paths L1 to Ln that connect three or more input output terminals 12a to 12n to the common terminal 11, respectively. The filter circuit 1b is different from the filter circuit 1 according to Embodiment 1 in that one or more paths are provided in addition to two paths L1 and L2. The filter 10n and an amplifier circuit 20n are disposed on the path Ln, and an output terminal 40n of the phase adjustment circuit 30 is connected to the path Ln. The filter circuit 1b is identical to the filter circuit 1 according to Embodiment 1 except for this, and repeated description of identical parts are omitted. The filter 10n is, for example, a band pass filter that is constituted by an acoustic wave filter, as with the filters 10a and 10b. The filter 10n is not limited to an acoustic wave filter and may be a different filter (e.g., LC filter) and is not limited to a band pass filter and may be a filter, such as a low pass filter, a high pass filter, or a band elimination filter. The paths L1 to Ln may include a path on which a filter or an amplifier circuit is not disposed.

In Embodiment 3, the plurality of paths L1 to L3 are connected to the common terminal 11. This leads to a risk of an increase in insertion loss on the path L1 due to leakage of a signal in a first frequency band not only to the path L2 but also to the path Ln. In view of this, the phase adjustment circuit 30 according to the present embodiment has output terminals 40b to 40n connected to the plurality of paths L2 to Ln, respectively. With this configuration, the phase adjustment circuit 30 adjusts a phase of an input signal in the first frequency band and transmits the adjusted signal not only to the path L2 but also to the other paths Ln. For example, the phase adjustment circuit 30 inverts the input signal by about 180 degrees and transmits the inverted signal to the paths L2 to Ln. Accordingly, when the signal in the first frequency band leaks to the paths L2 to Ln, the leaking signal in the first frequency band are reflected without necessarily being able to enter the paths L2 to Ln since a signal whose phase has been inverted with respect to the signal in the first frequency band has been transmitted to the paths L2 to Ln. It is therefore possible to prevent the signal in the first frequency band from leaking to the paths L2 to Ln. Specifically, since a signal whose phase has been inverted with respect to the signal in the first frequency band is transmitted to the paths L2 to Ln, impedance in the first frequency band obtained when the paths L2 to Ln are viewed from the common terminal 11 is brought into an open state.

Since it becomes easier for the signal in the first frequency band to be totally reflected on the path L2, signal leakage to the path L2 can be suppressed. Furthermore, since it becomes easier for the signal in the first frequency band to be totally reflected on the other paths Ln, signal leakage to the paths Ln can be suppressed. It is therefore possible to effectively reduce an insertion loss on the path L1. Furthermore, since the signal in the first frequency band optional for the paths L2 to Ln is harder to enter the paths L2 to Ln, noise caused by the signal in the first frequency band can be reduced.

Embodiment 4

The filter circuits described in Embodiments 1 to 3 described above are applicable to a communication device. In view of this, such a communication device is described in the present embodiment.

Figure 12:
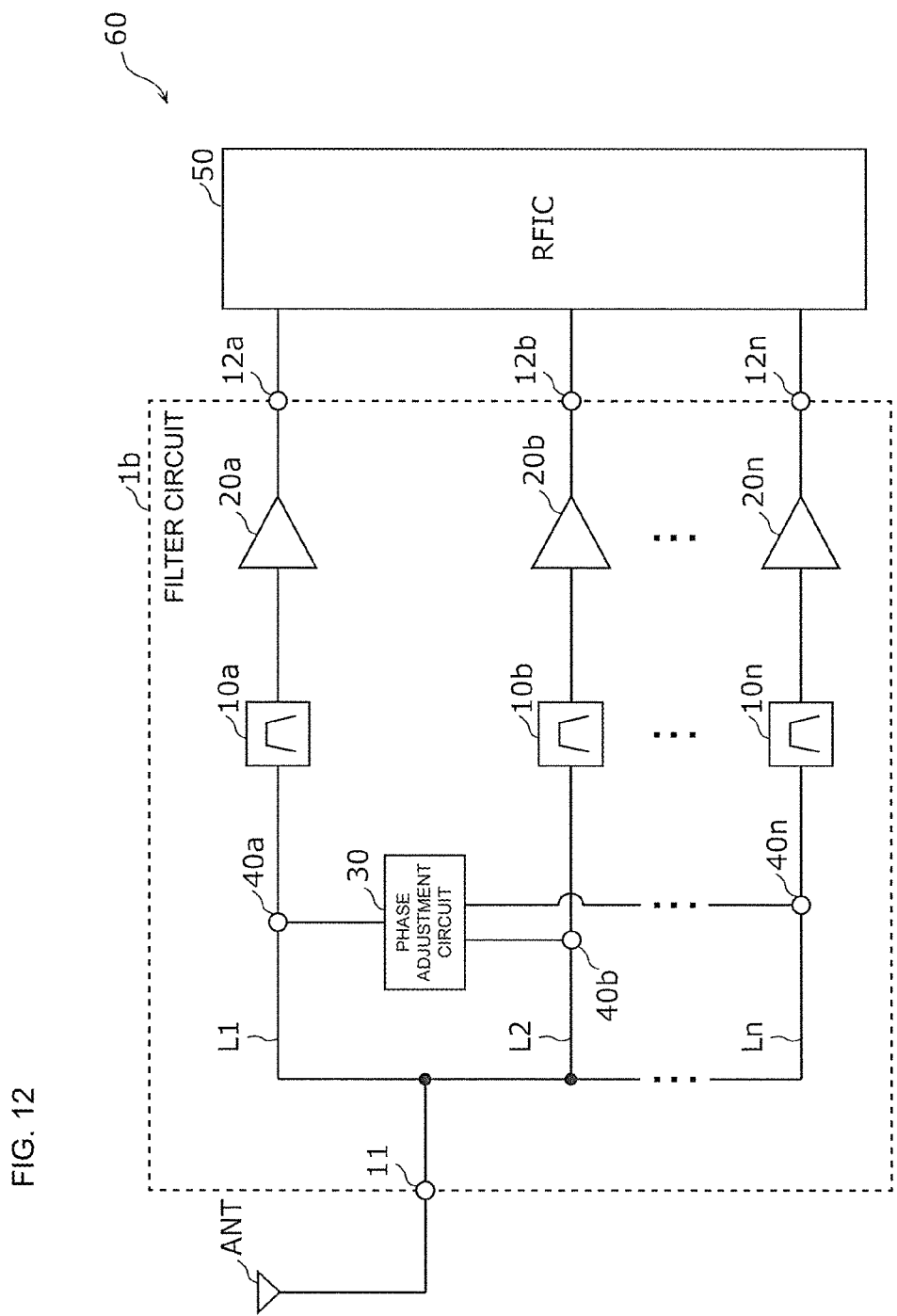
FIG. 12 is a configuration diagram illustrating a communication device according to Embodiment 4.

FIG. 12 is a configuration diagram illustrating a communication device 60 according to Embodiment 4. The communication device 60 includes an antenna element ANT, the filter circuit 1b, and an RFIC 50. Although the communication device 60 includes the filter circuit 1b according to Embodiment 3 in the present embodiment, the communication device 60 may include any of the filter circuits according to the other embodiments. The paths L1 to Ln may include a path on which a filter or an amplifier circuit is not provided. The antenna element ANT is provided in the communication device 60 but may be provided separately from the communication device 60.

The RFIC 50 is a circuit that processes a high-frequency signal transmitted or received by the antenna element ANT. Specifically, the RFIC 50 performs signal processing, such as downconversion on a high-frequency signal (a high-frequency received signal in this example) input from the antenna element ANT through the filter circuit 1b and outputs the received signal generated by the signal processing to a baseband signal processing circuit (BBIC). Although the filter circuit 1b is for receiving a signal, the filter circuit 1b may be for transmitting a signal. In this case, the RFIC 50 performs signal processing, such as upconversion on a transmission signal input from the baseband signal processing circuit (BBIC) and outputs a high-frequency signal (a high-frequency transmission signal) generated by the signal processing to the filter circuit.

As described above, the communication device 60 according to an aspect of the present disclosure includes the RFIC 50 that processes a high-frequency signal transmitted or received by the antenna element ANT and the filter circuit that transfers a high-frequency signal between the antenna element ANT and the RFIC 50.

It is therefore possible to provide a communication device that can effectively reduce an insertion loss.

Other Embodiments

Although a filter circuit and a communication device according to the present disclosure have been described above in the embodiments, the present disclosure is not limited to these embodiments.

Other embodiments realized by combining constituent elements in the above embodiments, various modifications of the above embodiments which a person skilled in the art can think of within the spirit of the present disclosure, and various apparatuses including a high-frequency module according to the present disclosure are also encompassed in the present disclosure.

For example, although the filter circuit includes the amplifier circuits 20a and 20b in the above embodiments, the filter circuit need not include the amplifier circuits 20a and 20b.

Furthermore, for example, the phase adjustment circuit 30 may have a configuration obtained by combining any of the first to seventh examples.

The present disclosure can be widely used for communication devices, such as mobile phones as a filter circuit applicable to a multiband system.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A filter circuit comprising:
a first filter that is in a first path and that has a pass band comprising frequencies in a first frequency band, the first path connecting a common terminal and a first input-output terminal;
a second filter that is in a second path and that has a pass band comprising frequencies in a second frequency band, the second path connecting the common terminal and a second input-output terminal, and the second frequency band being different from the first frequency band; and
a phase adjustment circuit comprising an input terminal connected to the first path between the first filter and the first input-output terminal, and an output terminal connected to the second path between the common terminal and the second filter, the phase adjustment circuit being configured to adjust a phase of a signal in the first frequency band that is input from the first path and to output a signal having a phase different from the phase of the signal in the first frequency band to the output terminal,
wherein the first path and the second path are configured to pass a received signal.

2. The filter circuit according to claim 1, wherein the phase adjustment circuit comprises a phase shifter.

3. The filter circuit according to claim 1, wherein the phase adjustment circuit comprises a delay circuit.

4. The filter circuit according to claim 1, wherein the phase adjustment circuit comprises an inverting circuit.

5. The filter circuit according to claim 1, wherein the phase adjustment circuit comprises a balun.

6. The filter circuit according to claim 1, wherein the phase adjustment circuit is configured to variably adjust the phase of the signal in the first frequency band.

7. The filter circuit according to claim 1, further comprising:
   a first amplifier circuit in the first path; and
   a second amplifier circuit in the second path, wherein:
   the input terminal is connected between the common terminal and the first amplifier circuit, and
   the output terminal is connected between the common terminal and the second amplifier circuit.

8. The filter circuit according to claim 1, further comprising:
   a first amplifier circuit in the first path, wherein the input terminal is connected between the first filter and the first amplifier circuit.

9. A communication device comprising:
   a radio frequency (RF) signal processing circuit configured to process a high-frequency signal transmitted or received by an antenna; and
   the filter circuit according to claim 1 configured to transfer the high-frequency signal between the antenna and the RF signal processing circuit.

* * * * *